United States Patent
Evirgen et al.

(10) Patent No.: US 10,749,064 B2
(45) Date of Patent: Aug. 18, 2020

(54) RADIATION DETECTOR AND ASSOCIATED IMAGER

(71) Applicants: THALES, Courbevoie (FR); COMMISSARIAT À L'ÉNERGIE ATOMIQUE ET AUX ÉNERGIES ALTERNATIVES, Paris (FR)

(72) Inventors: Axel Evirgen, Palaiseau (FR); Jean-Luc Reverchon, Palaiseau (FR)

(73) Assignees: THALES, Courbevoie (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/316,020

(22) PCT Filed: Jul. 7, 2017

(86) PCT No.: PCT/EP2017/067129
§ 371 (c)(1),
(2) Date: Jan. 7, 2019

(87) PCT Pub. No.: WO2018/007603
PCT Pub. Date: Jan. 11, 2018

(65) Prior Publication Data
US 2020/0044110 A1   Feb. 6, 2020

(30) Foreign Application Priority Data

Jul. 8, 2016 (FR) .................................... 16 01065

(51) Int. Cl.
*H01L 31/109* (2006.01)
*H01L 31/0352* (2006.01)

(52) U.S. Cl.
CPC ...... *H01L 31/109* (2013.01); *H01L 31/03529* (2013.01)

(58) Field of Classification Search
CPC ..................................................... H01L 31/109
See application file for complete search history.

(56) References Cited

U.S. PATENT DOCUMENTS

| 4,254,429 A | 3/1981 | Yamazaki |
| 9,515,210 B2 * | 12/2016 | Wei ................. H01L 31/035236 |

(Continued)

FOREIGN PATENT DOCUMENTS

FR   2800201 A1   4/2001

OTHER PUBLICATIONS

International Search Report and Written Opinion, issued by International Searching Authority in corresponding International Application No. PCT/EP2017/067129, dated Oct. 4, 2017, (PCT/ISA/210 & PCT/ISA/237).

*Primary Examiner* — Eugene Lee
(74) *Attorney, Agent, or Firm* — Arent Fox LLP (57) ABSTRACT

The invention relates to a radiation detector comprising a stack of superimposed layers successively comprising: an absorbent layer configured to absorb the radiation and made from a first semiconductor material, a screen charges layer made from a semiconductor material having a second bandgap value, a transition layer made from a semiconductor material having a third bandgap value, and a transition layer made from a semiconductor material having a third bandgap value, the absorbent layer and the screen charges layer having a doping of a first type, the first window layer having a doping of a second type, a dopant density of the window layer being greater than the dopant density of the transition layer.

10 Claims, 4 Drawing Sheets

(56) References Cited

U.S. PATENT DOCUMENTS

| | | | |
|---|---|---|---|
| 2002/0027238 A1* | 3/2002 | Lin | B82Y 20/00 |
| | | | 257/292 |
| 2003/0122210 A1* | 7/2003 | Cohen | H01L 31/03529 |
| | | | 257/465 |
| 2013/0313608 A1 | 11/2013 | Ishibashi et al. | |

* cited by examiner

RADIATION DETECTOR AND ASSOCIATED IMAGER

CROSS-REFERENCE TO RELATED APPLICATIONS

This application is a National Stage entry of International Application PCT/EP2017/067129, filed Jul. 7, 2017, which claims priority to French Application No. 16 01065, filed on Jul. 8, 2016. The disclosure of which is hereby incorporated by reference in its entirety.

FIELD OF THE INVENTION

The present invention relates to a radiation detector and an imager comprising a plurality of such radiation detectors.

BACKGROUND OF THE INVENTION

Many types of radiation detectors include a set of superimposed semiconductor layers, comprising an absorbent layer, the energy gap of which is adapted so that the absorbent layer absorbs a radiation, thus generating an electron-hole pair. The band structure of such detectors is provided so that the electron and the hole thus generated are separated from one another and an electric current therefore appears when the radiation is absorbed. A radiation detector of the aforementioned type is for example known from document FR 2,800,201 A1.

However, other mechanisms for generating a current may also exist in such a structure, giving rise to an electric current called dark current, which is not correlated to the absorption of the radiation. The dark current then limits the sensitivity of the detector, since the electric signal supplied by the detector is no longer solely representative of the detected radiation.

Such detectors are used for many applications, ranging from photographic sensors detecting visible rays to imagers operating in the infrared range. In particular, infrared detectors are particularly sensitive to dark currents, which are non-negligible in all cases faced with the currents generated by the radiation.

In order to improve the sensitivity of high-performance infrared detectors, the latter are generally cooled at a low temperature, for example around 80 Kelvin (K) or less.

However, the cryogenic systems used consume considerable energy, and are heavy and bulky, which is problematic for many uses. Furthermore, during the initialization of the detector, reaching the aiming temperature slows the use of the detectors.

Furthermore, the dark current includes generation-recombination and diffusion components with different thermal activation laws. In particular, the dark current related to the generation-recombination phenomena is predominant at low temperatures.

SUMMARY OF THE INVENTION

There is therefore a need for a radiation detector that has a better sensitivity than the existing detectors, in particular at a temperature greater than 80 K. To that end, proposed is a radiation detector having a stack of layers on top of one another, the stack successively comprising, in a stacking direction, an absorbent layer configured to absorb the radiation and made from a first semiconductor material having a first bandgap value, a screen charges layer made from a second semiconductor material having a second bandgap value, the second bandgap value being strictly greater than the first bandgap value, a transition layer made from a third semiconductor material having a third bandgap value, the third bandgap value being strictly greater than the first bandgap value, and a first window layer made from a fourth semiconductor material having a fourth bandgap value, the fourth bandgap value being strictly greater than the first bandgap value. The absorbent layer and the screen charges layer each have a doping of a first type, the first window layer having a doping of a second type different from the first type, the transition layer having a doping of the first type or a doping of the second type, a density of dopants being defined for each of the first window layer and the transition layer, the density of dopants of the window layer being strictly greater than the density of dopants of the transition layer.

According to specific embodiments, the detector comprises one or more of the following features, considered alone or according to any technically possible combinations:
  the transition layer has a doping of the second type.
  a density of dopants is defined for each of the absorbent layer and the screen charges layer, the density of dopants of the absorbent layer being strictly less than the density of dopants of the screen charges layer.
  the second dopant density is between $10^{16}$ and $10^{17}$ atoms per cubic centimeter.
  the first material and the second material are chosen so that the absorbent layer and the screen charges layer form an interface of type II, or have no energy barrier to a movement from the absorbent layer to the screen charges layer of the minority charge carriers in the absorbent layer.
  the second material and the third material are chosen so that the screen charges layer and the transition layer form an interface of type II, or have no energy barrier to a movement from the screen charges layer to the transition layer of the minority charge carriers in the absorbent layer.
  the stack further comprises a second window layer made from a fifth semiconductor material having a fifth bandgap value and an intermediate layer made from a sixth semiconductor material having a sixth bandgap value, the absorbent layer being delimited in the stacking direction by the screen charges layer and the intermediate layer, the intermediate layer being delimited in the stacking direction by the absorbent layer and the second window layer, the fifth bandgap value being strictly greater than the first bandgap value and the sixth bandgap value being comprised between the fifth bandgap value and the first bandgap value.
  the intermediate layer has a doping of the first type, a density of dopants being defined for the intermediate layer, the density of dopants of the intermediate layer being greater than or equal to the density of dopants of the absorbent layer.
  the first material, the second material, the third material and the fourth material are semiconductor materials with a base of elements from columns IIIA and VA of the periodic table of elements.
  the first window layer includes a first portion having a doping of the second type and at least one second portion having a doping of the first type, the second portion separating each first portion from each other first portion and each first portion being surrounded by the second portion in a plane perpendicular to the stacking direction.

BRIEF DESCRIPTION OF THE DRAWINGS

These features and advantages of the invention will also appear upon reading the following description, provided solely as a non-limiting example, and done in reference to the appended drawings, in which.

DETAILED DESCRIPTION OF PREFERRED EMBODIMENTS

For the rest of the description, a longitudinal direction is defined. A stacking direction and a transverse direction are also defined. The stacking direction is a direction perpendicular to the longitudinal direction and contained in a transverse plane relative to the longitudinal direction. The stacking direction corresponds to a general propagation direction of the light. The transverse direction is perpendicular to the longitudinal direction and the stacking direction. The longitudinal, stacking and transverse directions are respectively symbolized by the axis X, an axis Z and an axis Y in FIG. 1.

Figure 1:
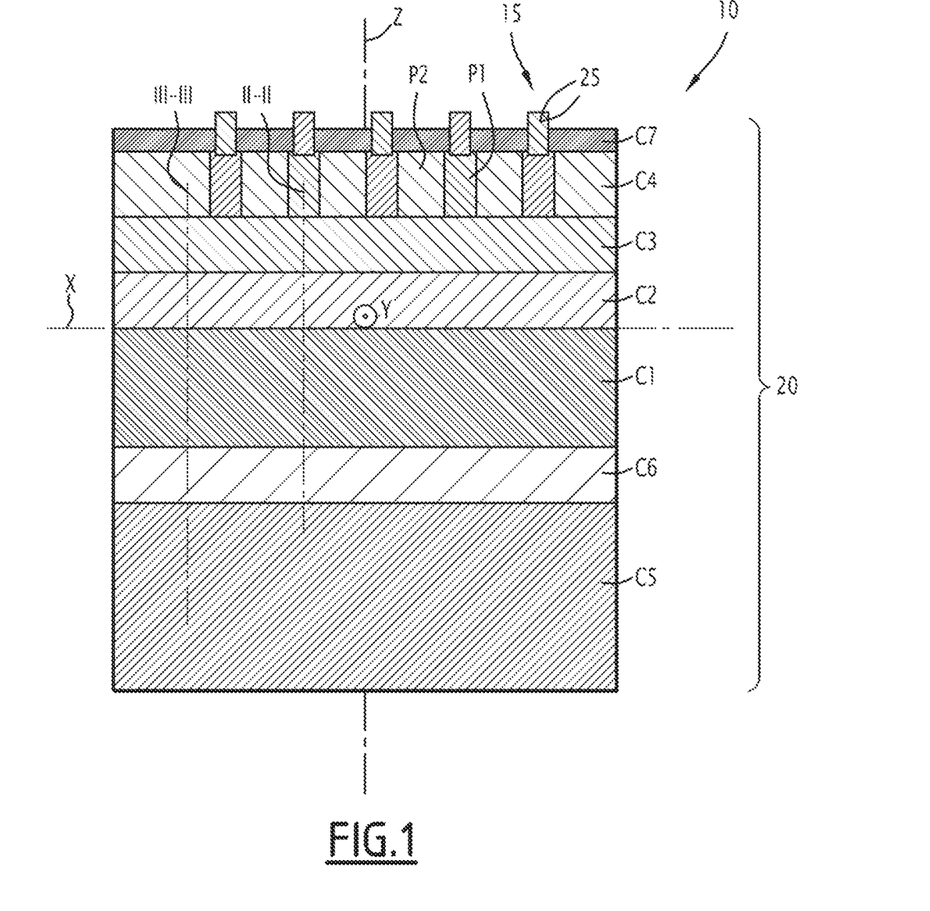
FIG. 1 is a schematic sectional view of an imager comprising a plurality of radiation detectors.

An imager 10 is shown in FIG. 1.

The imager 10 includes a plurality of radiation detectors 15 and a reading circuit. For example, the imager 10 includes a two-dimensional matrix of radiation detectors 15.

The imager 10 is configured to generate an image Im comprising a plurality of pixels. The pixel is the basic unit making it possible to measure the definition of a matricial digital image. The word pixel comes from the phrase picture element.

Each radiation detector 15 is identical to the other radiation detectors 15. An example radiation detector 15 will be described below.

Each radiation detector 15 corresponds to a pixel of the image Im. In particular, each radiation detector 15 is able to generate an electric signal S when the radiation detector 15 absorbs a ray IR. The electric signal S is intended to allow the imager 10 to generate the corresponding pixel.

Each radiation detector 15 has a spectral operating range. The spectral operating range of the radiation detector 15 belongs to one of the following spectral ranges: the infrared, the near-infrared, the medium infrared and the far infrared.

An electromagnetic wave OE belongs to the infrared range if a wavelength of the wave OE is, broadly speaking, between 780 nanometers (nm) and 25 micrometers (µm). An electromagnetic wave belongs to the near infrared if the wavelength of the wave is, broadly speaking, between 780 nm and 3 µm.

A wave belongs to the far infrared if the wavelength of the wave OE is, broadly speaking, between 3 µm and 8 µm.

A wave belongs to the far infrared if the wavelength of the wave OE is, broadly speaking, between 8 µm and 15 µm.

Alternatively, the spectral operating range belongs to the visible range. The visible range is made up of electromagnetic waves OE whereof the wavelength is, broadly speaking, between 400 nm and 800 nm.

Each radiation detector 15 comprises a stack 20 of layers that are superimposed in the stacking direction Z, a first electrode 25 and a second electrode. "Superimposed layers" means that the layers are arranged on top of one another in the stacking direction Z.

The stack 20 therefore comprises a series of layers in the stacking direction Z. Each layer of the stack 20 is therefore defined by a thickness in the stacking direction Z.

The stack 20 further extends in the longitudinal direction X and in the transverse direction Y, since each layer of the stack 20 is defined by a length in the longitudinal direction X and a width in the transverse direction Y.

The stack 20 of superimposed layers successively comprises, in the stacking direction Z, an absorbent layer C1, a screen charges layer C2, a transition layer C3 and a first window layer C4.

According to the example of FIG. 1, each stack 20 further includes a second window layer C5, an intermediate layer C6 and a passivation layer C7.

The absorbent layer C1 is able to absorb at least part of the radiation IR.

The absorbent layer C1 is shared by all of the detector elements 15 of the imager 10.

The absorbent layer C1 is made from a first semiconductor material M1 having a first bandgap value G1.

"Bandgap value" of a material refers to the value of the width of the bandgap between the valence band and the conduction band in the material. The bandgap value of a material is for example expressed in electron-volts (eV).

The valence band is defined as being, from among the energy bands allowed for an electron in the material, the band that has the highest energy while being completely filled at a temperature of less than or equal to 20 K.

A first energy level is defined for each valence band. The first energy level is the highest energy level of the valence band.

The conduction band is defined as being, from among the energy bands allowed for an electron in the material, the band that has the lowest energy while not being filled at a temperature of less than or equal to 20 K.

A second energy level is defined for each conduction band. The second energy level is the lowest energy level of the conduction band.

Thus, each bandgap value is measured between the first energy level and the second energy level of the material in question.

"Semiconductor material" refers to a material having a bandgap value strictly greater than zero and less than or equal to 6.5 eV.

The first material M1 may or may not be a composite material.

A composite material is an assembly of at least two elements.

Each element forming the first material M1 belongs to one of the columns of the periodic table from among the following columns: IIb, IIIa, IVa, Va and VIa.

The periodic table used is the table by increasing atomic number established by Moseley in the early 20th century.

Group IIb of the periodic table is also called group XII. Group II in particular comprises zinc (Zn), cadmium (Cd) and mercury (Hg).

Group IIIa of the periodic table is also called group XIII. Group IIIa corresponds to the boron group and in particular comprises boron (B), aluminum (Al), gallium (Ga) and indium (In).

Group IVa of the periodic table is also called group XIV. Group IVa in particular comprises silicon (Si) and germanium (Ge).

Group Va of the periodic table is also called group XV or nitrogen family. Group Va in particular comprises nitrogen (N), phosphorus (P), arsenic (As) and antimony (Sb).

Group VIa of the periodic table is also called group XVI. Group VIa in particular comprises oxygen (O), sulfur (S) and selenium (Se).

Advantageously, the materials from columns IIIa and IIa may respectively be associated with materials from columns Va and VIa to produce hetero-structures for photodetectors. These will be called II-VI or III-V alloys.

The first material M1 is a material with a base of elements from columns IIIa and Va of the periodic table of elements. The first material M1 is for example indium arsenide-antimonide InAsSb.

The absorbent layer C1 has a first thickness e1 in the stacking direction Z.

The absorbent layer C1 is planar. This means that the first thickness e1 is uniform, to within 10%. "Uniform thickness" of a layer means that the thickness of the layer is identical at all points of the layer.

The absorbent layer C1 further has a width in the longitudinal direction X and a length in the transverse direction Y. The term "planar layer" also means that the length and the width are each strictly greater than ten times the thickness of the layer.

The absorbent layer C1 is perpendicular to the stacking direction Z.

The absorbent layer C1 is delimited, in the stacking direction Z, by the screen charges layer C2 and the intermediate layer C6.

The first thickness e1 is between 100 mm and 10 µm.

The absorbent layer C1 has a doping of a first type.

Doping is defined as the presence, in a material, of impurities contributing free charge carriers. The impurities are for example atoms of an element that is not naturally present in the material.

When the presence of impurities increases the hole density in the material relative to the non-doped material, the doping is p-type doping. For example, an InAsSb layer is p-doped by adding atoms of beryllium (Be), cadmium (Cd) or zinc (Zn).

When the presence of impurities increases the free electron density in the material relative to the non-doped material, the doping is n-type doping. For example, an InAsSb layer is n-doped by adding tellurium (Te) or silicon (Si) atoms.

The first type of doping is chosen from among n-doping and p-doping. For example, the first type of doping is n-doping.

A first density of dopants d1 is defined for the absorbent layer C1. A dopant density is defined, for a material, as the number of dopant atoms per unit of volume.

The first density of dopants d1 is uniform. This means that, if the first dopant density d1 is measured, the measured value does not depend on the location in the absorbent layer C1 where the measurement is done.

For example, the first dopant density d1 is measured by secondary ion mass spectrometry (SIMS). SIMS is a surface analysis method that consists of bombarding the surface of the specimen to be analyzed with an ion beam.

The first dopant density d1 is between $10^{14}$ and $10^{18}$ atoms per cubic centimeter (/cm$^3$). Alternatively, the first dopant density d1 has a gradient in the stacking direction Z.

"Gradient in the stacking direction Z" refers to a monotonous variation of the considered quantity in the considered direction. For example, the first dopant density d1 increases continuously in the stacking direction Z from the screen charges layer C2 to the intermediate layer C6, or vice versa.

The screen charges layer C2 is shared by all of the detector elements 15 of the imager 10.

The screen charges layer C2 separates the absorbent layer C1 from the transition layer C3 in the stacking direction Z. In particular, the screen charges layer C2 is delimited, in the stacking direction Z, by the absorbent layer C1 and by the transition layer C3.

The screen charges layer C2 is made from a second material M2.

The second material M2 is a semiconductor material. The second material M2 has a second bandgap value G2. The second bandgap value G2 is greater than the first bandgap value G1. For example, the second bandgap value G2 is strictly greater than the first bandgap value G1.

The second material M2 is a material with a base of elements from columns IIIa and Va of the periodic table of elements.

The second material M2 is a quaternary material. In particular, the second material M2 is made up of elements also making up the first material M1 and at least one other element. For example, when the first material M1 is InAsSb, the second material M2 is InAlAsSb. Alternatively, the second material M2 is InGaAsSb. Alternatively, the second material M2 may have a composition gradient in the direction Z.

The screen charges layer C2 has a doping of the first type.

A second density of dopants d2 is defined for the screen charges layer C2. For example, the second dopant density d2 is strictly greater than the first dopant density d1.

The second dopant density d2 is between $10^{14}$ atoms/cm$^3$ and $10^{17}$ atoms/cm$^3$.

The screen charges layer C2 is planar. The screen charges layer C2 is perpendicular to the stacking direction Z.

The screen charges layer C2 has a second thickness e2. The second thickness e2 is between 20 nm and 1 µm.

The screen charges layer C2 forms a type II interface with the absorbent layer C1.

A type II interface between two materials is defined as an interface in which a difference between the two first energy levels of the two materials in question has the same sign as a difference between the two second energy levels of the two materials in question. In other words, the material whose valence band has the highest energy also has the conduction band with the highest energy from among the two materials of the interface.

Alternatively, the screen charges layer C2 and the absorbent layer C1 do not form a discontinuity in the band of the minority charge carriers. The minority charge carriers in question are the minority charge carriers in the absorbent layer C1.

"Minority charge carrier" refers to a charge carrier whose density is not increased by the doping present in the material in question. For example, when the material is p-doped, the minority charge carriers are the electrons. When the material is n-doped, the minority charge carriers are the holes.

"Discontinuity" refers to an energy gap greater than three times kT between the conduction bands of the first material M1 and the second material M2 or between the valence bands of the first material M1 and the second material M2, T being the operating temperature of the imager 10 and k being the Boltzmann constant. "Band of the minority charge carriers" for a material refers to the conduction band when the material is p-doped and the valence band when the material is n-doped.

In other words, the screen charges layer C2 and the absorbent layer C1 have no energy barrier to a movement from the absorbent layer C1 to the screen charges layer C2 of the minority charge carriers in the absorbent layer C1.

The transition layer C3 is shared by all of the detector elements 15 of the imager 10.

The transition layer C3 is delimited, in the stacking direction Z, by the screen charges layer C2 and the first window layer C4. In particular, the transition layer C3 separates the screen charges layer C2 from the first window layer C4 in the stacking direction Z.

The transition layer C3 is intended to adjust the band offset for the minority charge carriers. In particular, the transition layer is configured not to form a barrier to a movement of the minority charge carriers from the screen charges layer to the first window layer C4.

The transition layer C3 is configured not to be passed through in the stacking direction Z by tunnel effect by the majority charge carriers in the absorbent layer C1. The majority charge carriers are the complementary charge carriers of the minority charge carriers, i.e., the holes when the minority carriers are the electrons and vice versa.

The transition layer C3 has a doping of the second type. The second type of doping is different from the first type of doping. The second type of doping is chosen from among p-doping and n-doping.

Alternatively, the transition layer C3 has a doping of the first type.

A third density of dopants d3 is defined for the transition layer C3.

The third dopant density d3 is for example between $10^{15}$ atoms/cm$^3$ and $10^{18}$ atoms/cm$^3$.

The transition layer C3 is made from a third material M3. The third material M3 is a semiconductor material.

The third material M3 is a semiconductor material. The third material M3 has a third bandgap value G3.

The third bandgap value G3 is strictly greater than the first bandgap value G1. For example, the third bandgap value G3 is greater than or equal to the second bandgap value G2.

The third material M3 is a material with a base of elements from columns IIIa and Va of the periodic table of elements. For example, the material M3 is gallium antimonide GaSb. Alternatively, the third material M3 is aluminum gallium arsenide-antimonide AlGaAsSb. According to other alternatives, the third material M3 is chosen from among indium gallium arsenide-antimonide InGaAsSb and indium aluminum arsenide-antimonide InAlAsSb.

Alternatively, the material M3 may have a composition gradient in the direction Z. The third material M3 is chosen so that the screen charges layer C2 and the transition layer C3 form a type II interface.

Alternatively, the third material M3 is chosen so that the screen charges layer C2 and the transition layer C3 do not form a discontinuity in the band of the minority charge carriers. The minority charge carriers in question are the minority charge carriers in the absorbent layer C1. In particular, the third material M3 is chosen so that the screen charges layer C2 and the transition layer C3 do not present an energy barrier to the movement of the minority carriers from the screen charges layer C2 to the transition layer C3 in the stacking direction Z.

The third material M3 is chosen so that the first window layer C4 and the transition layer C3 do not form a discontinuity in the band of the minority charge carriers. The minority charge carriers in question are the minority charge carriers in the absorbent layer C1. In particular, the third material M3 is chosen so that the first window layer C4 and the transition layer C3 do not present an energy barrier to the movement of the minority carriers toward the first window layer C4 from the transition layer C3 in the stacking direction Z.

The first window layer C4 is transparent to the radiation IR.

The first window layer C4 is shared by all of the detector elements 15 of the imager 10.

The first window layer C4 separates the transition layer C3 from the passivation layer C7 in the stacking direction Z. In particular, the first window layer C4 is delimited, in the stacking direction Z, by the transition layer C3 and by the passivation layer C7.

The first window layer C4 is made from a fourth material M4.

The fourth material M4 is a semiconductor material. The fourth material M4 has a fourth bandgap value G4.

The fourth bandgap value G4 is strictly greater than the first bandgap value G1. The fourth material M4 is an alloy of elements from columns IIIa and Va of the periodic table of elements. For example, the fourth material M4 is gallium antimonide GaSb.

The fourth bandgap value G4 is for example greater than or equal to the third bandgap value G3.

Alternatively, the fourth bandgap value G4 is strictly less than the third bandgap value G3.

The first window layer C4 is planar. The first window layer C4 is perpendicular to the stacking direction Z.

The first window layer C4 has a fourth thickness e4. The fourth thickness e4 is between 50 nm and 1 μm.

The first window layer C4 includes a first portion P1 and a second portion P2.

The first portion P1 is cylindrical. In other words, the first portion P1 has a cylinder shape.

A cylinder refers to the solid delimited by two strictly parallel planes and by a surface defined by a straight line, called generatrix, passing through a variable point describing a curve, called guide curve and keeping a fixed direction. If the planes are perpendicular to the generatrix, the cylinder is said to be "straight".

The generatrix of the first portion P1 is parallel to the stacking direction Z. The planes are perpendicular to the stacking direction Z. The guide curve of the first portion P1 is for example circular. Alternatively, the guide curve of the first portion P1 is polygonal.

The first portion P1 is delimited, in the stacking direction Z, by the transiion layer C3, the passivation layer C7 and the first electrode 25. In particular, the first portion P1 is electrically connected to the transition layer C3 and the first electrode 25.

The first portion P1 is configured to be passed through in the stacking direction Z by the minority charge carriers in the absorbent layer C1.

The first portion P1 has a doping of the second type. The first portion P1 has a fourth dopant density d4.

The fourth dopant density d4 is strictly greater than the third dopant density d3. For example, the fourth dopant density d4 is between $10^{15}$ atoms/cm$^3$ and $10^{19}$ atoms/cm$^3$.

For example, the third dopant density d3 is between one one-hundredth of the fourth dopant density d4 and one tenth of the fourth dopant density d4 when the fourth dopant density d4 is between $5.10^{17}$ atoms/cm$^3$ and $10^{19}$ atoms/cm$^3$.

The second portion P2 surrounds the first portion P1 in a plane perpendicular to the stacking direction Z. In particular, the second portion P2 separates the first portion P1 from the other first portions P1 of the imager 10.

The second portion P2 is shared by all of the detector elements 15 of the imager 10.

The second portion P2 is delimited, in the stacking direction Z, by the transition layer C3 and the passivation layer C7.

The second portion P2 is configured not to be passed through in the stacking direction Z by the minority charge carriers in the absorbent layer C1.

The second portion P2 has a doping of the first type. The second portion P2 has a dopant density d2 between $10^{14}$ atoms/cm$^3$ and $10^{18}$ atoms/cm$^3$.

The first portion P1 and the second portion P2 are for example made by local insertion into a layer having the first type of atom doping causing doping of the second type. Thus, the portions of the layer in which no atom is inserted have the first type of doping and form the second portion P2. The portions of the layer in which the atoms have been inserted then have the second type of doping and form the first portion P1. The atoms are inserted by ion implantation or by diffusion.

The second window layer C5 is transparent to the radiation IR.

The second window layer C5 is shared by all of the detector elements 15 of the imager 10.

The second window layer C5 for example forms a substrate for the other layers of the stack 20.

The second window layer C5 is configured to transmit an electric current between the second intermediate layer C6 and the second electrode.

The second window layer C5 is delimited, in the stacking direction Z, by the second intermediate layer C6.

The second window layer C5 is made from a fifth material M5.

The fifth material M5 is a semiconductor material. The fifth material M5 has a fifth bandgap value G5.

The fifth bandgap value G5 is strictly greater than the first bandgap value G1.

The fifth material M5 is an alloy of elements from columns IIIa and Va of the periodic table of elements. For example, the fifth material M5 is gallium antimonide GaSb.

The fifth material M5 has a doping of the first type.

The second window layer C5 is planar. The second window layer C5 is perpendicular to the stacking direction Z.

The second window layer C5 has a fifth thickness e5. The fifth thickness e5 is between 50 nm and 100 μm.

The intermediate layer C6 is transparent to the radiation IR.

The intermediate layer C6 is shared by all of the detector elements 15 of the imager 10.

The intermediate layer C6 separates the absorbent layer C1 from the second window layer C5 in the stacking direction Z. In particular, the second intermediate layer C6 is delimited, in the stacking direction Z, by the absorbent layer C1 and by the second window layer C5.

The intermediate layer C6 is made from a sixth material M6.

The sixth material M6 is a semiconductor material. The sixth material M6 has a sixth bandgap value G6.

The sixth bandgap value G6 is greater than or equal to the first bandgap value G1. For example, the sixth bandgap value G6 is strictly greater than the first bandgap value G1.

The sixth bandgap value G6 is less than or equal to the fifth bandgap value G5, for example strictly less.

The sixth material M6 is a material with a base of elements from columns IIIa and Va of the periodic table of elements.

The sixth material M6 is a ternary material or a quaternary material. When the sixth material M6 is a quaternary material, the sixth material M6 is made up of elements also making up the first material M1. For example, when the first material M1 is InAsSb, the sixth material M6 is InAlAsSb. Alternatively, the sixth material M6 is InGaAsSb. Alternatively, the sixth material M6 may have a composition gradient in the direction Z.

The intermediate layer C6 has a doping of the first type.

A sixth dopant density d6 is defined for the intermediate layer C6. The sixth dopant density d6 is strictly greater than the second dopant density d2.

The intermediate layer C6 is planar. The intermediate layer C6 is perpendicular to the stacking direction Z.

The intermediate layer C6 has a sixth thickness e6. The sixth thickness e6 is between 20 nm and 1 μm.

The intermediate layer C6 forms a type II interface with the absorbent layer C1.

The passivation layer C7 is transparent to the radiation IR.

The passivation layer C7 is shared by all of the detector elements 15 of the imager 10.

The passivation layer C7 is configured to electrically isolate the first window layer C1 from the outside of the stack 20.

The passivation layer C7 is made from an eighth material M8.

The eighth material M8 is electrically insulating. For example, the eighth material M8 is a dielectric material such as silicon oxide $SiO_2$ or silicon nitride $Si_3N_4$.

The passivation layer C7 is provided to prevent the first window layer C4 from being modified by a chemical reaction with the atmosphere. For example, the passivation layer C7 is provided to prevent the first window layer C4 from being oxidized by the ambient air.

The first electrode 25 is in electric contact with the first portion P1.

The first electrode 25 passes through the passivation layer C7 in the stacking direction.

The second electrode is in electric contact with the second window layer C5.

The reading circuit is configured to receive the electrical signal S from each detector element 15 and to generate an image Im from each electrical signal S.

The operation of the imager 10 will now be described.

A difference in potential is applied by the reading circuit between the first electrode 25 and the second electrode of each detector element 15.

When the radiation IR illuminates a detector element 15, the radiation IR is absorbed in the absorbent layer C1.

The absorption of the radiation IR in the absorbent layer C1 generates an electron-hole pair (also called exciton).

The separation of the electron-hole pair gives rise to the electrical signal S. The electrical signal S is an electric current.

Such an operating mode for the detector element 15 is called "photovoltaic mode".

The electrical signal S successively passes through the second electrode, the second window layer C5, the intermediate layer C6, the absorbent layer C1, the screen charges layer C2, the transition layer C3, the first window layer C4 and the electrode layer 25 in the stacking direction Z.

The electrical signal S is detected by the reading circuit through the first electrode 25.

Figure 2:
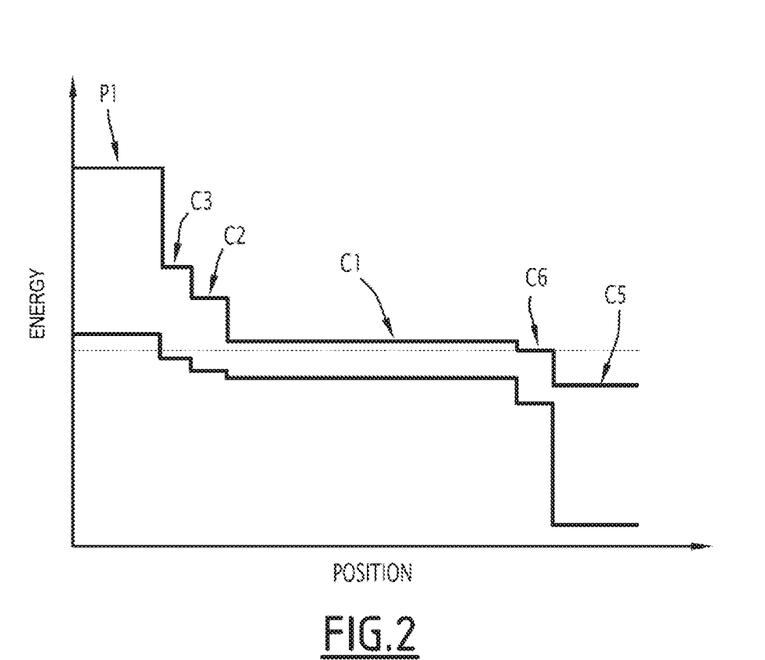
FIG. 2 is a block diagram of energy bands of the detector of FIG. 1, along line II-II, considering the energy bands of the different materials to be flat.

A band diagram showing the energy levels of the valence band and the conduction band of a detector element 15 as a function of the position along the line II-II of FIG. 1, which passes through the first portion P1, has been shown in FIG. 2. The diagram of FIG. 2 is a block diagram in which the energy levels are considered to be uniform in the various materials and the interface and space charge effects are not considered in order to facilitate the comparison of the different bandgap values G1 to G6.

Figure 3:
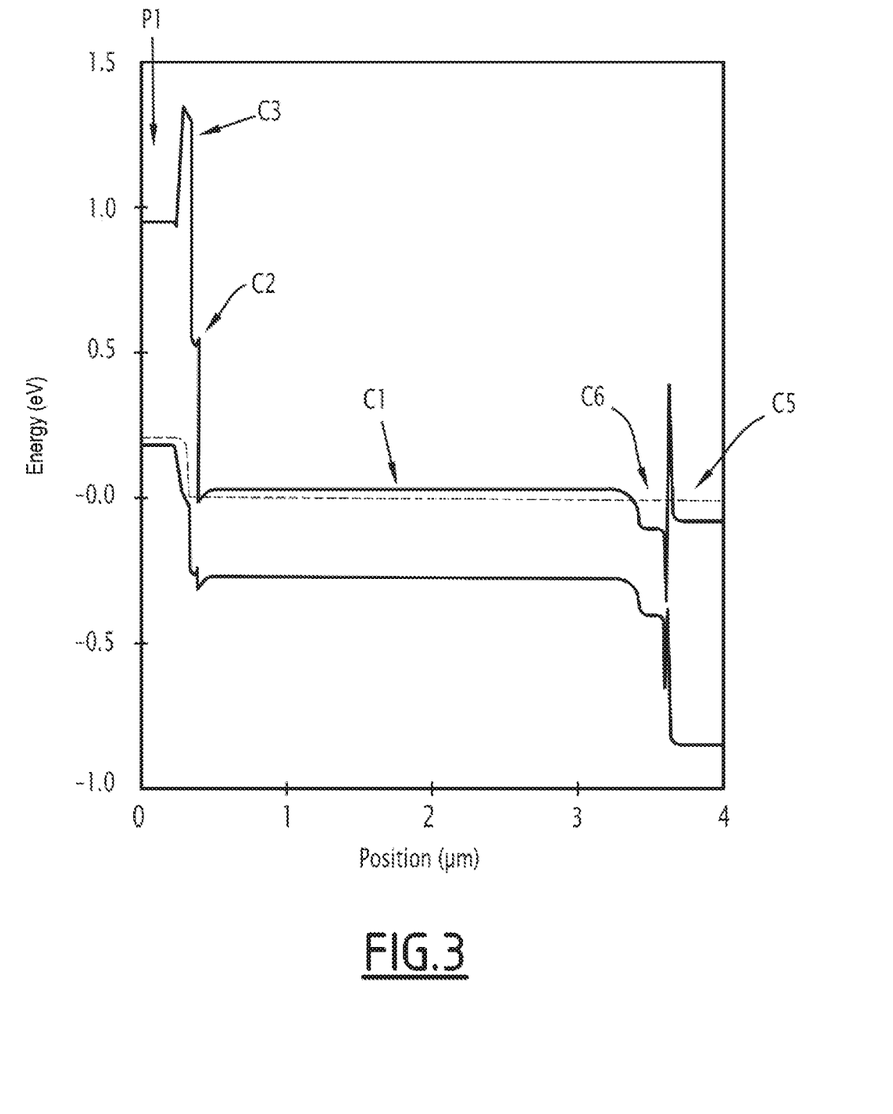
FIG. 3 is a diagram of the energy bands along line II-II of an example detector obtained by digital simulation.

FIG. 3 shows a diagram of the energy bands along line II-II, obtained by digital simulation and taking account of the effects not taken into account by the diagram of FIG. 2.

In FIGS. 2 to 5, the Fermi level has been shown by a broken line, the conduction band and the valence band by continuous lines.

The band structure does not have a barrier able to oppose the movement of the holes from the absorbent layer C1 to the first electrode 25.

The band structure does not have a barrier able to oppose the movement of the electrons from the absorbent layer C1 to the second electrode.

Figure 4:
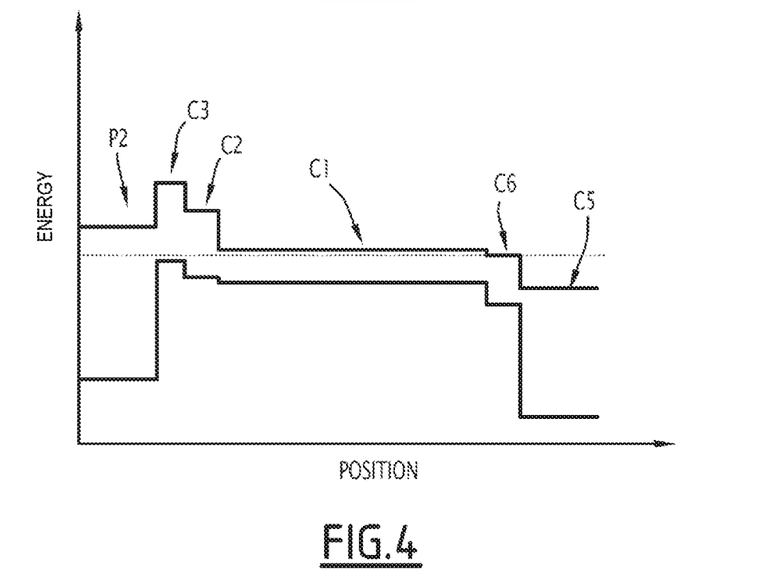
FIG. 4 is a block diagram of energy bands of the detector of FIG. 1, along line III-III, considering the energy bands of the different materials to be flat.

A band diagram showing the energy levels of the valence band and the conduction band of a detector element 15 as a function of the position along the line III-III of FIG. 1, which passes through the second portion P2, has been shown in FIG. 4. The diagram of FIG. 4 is a block diagram in which the energy levels are considered to be uniform in the various materials and the interface and space charge effects are not considered in order to facilitate the comparison of the different bandgap values G1 to G6.

Figure 5:
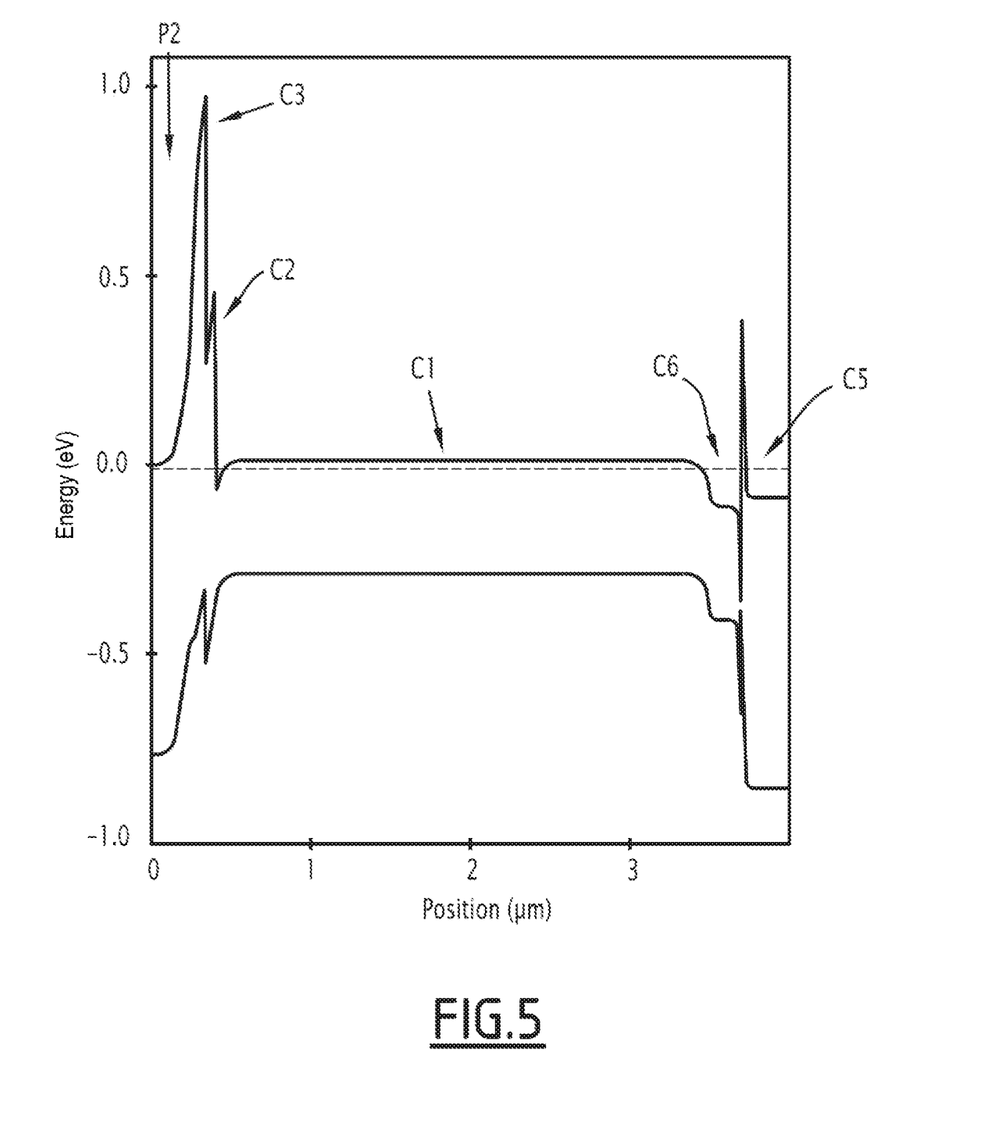
FIG. 5 is a diagram of the energy bands along line III-III of an example detector obtained by digital simulation.

FIG. 5 shows a diagram of the energy bands along line III-III, obtained by digital simulation and taking account of the effects not taken into account by the diagram of FIG. 4.

The band structure then confines the perimeters of the two types in the absorbent layer C1.

The screen charges layer C2 and the transition layer C3 make it possible to decrease the electric field in the absorbent layer C1. The depletion zone that exists at the interface between two layers having different types of doping is confined to the screen charges layer C2 and the transition layer C3. In particular, the absorbent layer C1 does not have a depletion zone.

Thus, the absorbent layer C1 has a flat band. The dark currents caused by generation-recombination mechanisms are therefore limited, as explained in an article by G. Marre et al. that appeared in the review "Semiconductor Science and Technology" no. 18, page 284 in 2002.

The imager 10 therefore has a better sensitivity than the imagers of the state of the art, at an equal temperature. The imager 10 can also be used at an operating temperature higher than the imagers of the state of the art, with an equal sensitivity.

Owing to the presence of the transition layer C3, the structure does not have a barrier or strong discontinuity that may be detrimental to the diffusion of the minority carriers. The sensitivity of the imager 10 is therefore, here again, improved.

The first example was described above in the particular case in which the semiconductor materials used are massive materials made from III-V semiconductors. One skilled in the art will easily understand that other types of semiconductor materials can be used. For example, the materials used are II-VI materials, or nitride semiconductors in which the atoms from column Va are nitrogen atoms.

Alternatively, at least one semiconductor material is a super-network. In semiconductor physics, a super-network is a periodic stack of thin layers, typically several nanometers. If the layers are thin enough for a quantum confinement of the carriers to take place in the layers, quantum coupling between the different layers causes the appearance of energy "mini-bands". The energies of these mini-bands are then dependent on the thickness and the composition of the layers used. For example, the InAs—GaSb super-network was primarily studied for infrared detection.

According to another alternative, the first type of doping is p-doping and the second type of doping is n-doping.

The various examples and alternatives previously described can be combined with one another to form new embodiments.

The invention claimed is:

1. A radiation detector comprising a stack of superimposed layers, the stack successively comprising, in a stacking direction:
    an absorbent layer configured to absorb the radiation and made from a first semiconductor material having a first bandgap value,
    a screen charges layer made from a second semiconductor material having a second bandgap value, the second bandgap value being strictly greater than the first bandgap value,
    a transition layer made from a third semiconductor material having a third bandgap value, the third bandgap value being strictly greater than the first bandgap value, and
    a first window layer made from a fourth semiconductor material having a fourth bandgap value, the fourth bandgap value being strictly greater than the first bandgap value,
    the absorbent layer and the screen charges layer each having a doping of a first type, the first window layer having a doping of a second type different from the first type, the transition layer having a doping of the first type or a doping of the second type, a density of dopants being defined for each of the first window layer and the transition layer, the density of dopants of the window layer being strictly greater than the density of dopants of the transition layer.

2. The radiation detector according to claim 1, wherein the transition layer has a doping of the second type.

3. The radiation detector according to claim 1, wherein a density of dopants is defined for each of the absorbent layer and the screen charges layer, the density of dopants of the absorbent layer being strictly less than the density of dopants of the screen charges layer.

4. The radiation detector according to claim 1, wherein the second density is between $10^{16}$ and $10^{17}$ atoms per cubic centimeter.

5. The radiation detector according to claim 1, wherein the first material and the second material are chosen so that the absorbent layer and the screen charges layer:
    form a type II interface, or
    have no energy barrier to a movement from the screen charges layer to the transition layer of the minority charge carriers in the absorbent layer.

6. The radiation detector according to claim 1, wherein the second material and the third material are chosen so that the screen charges layer and the transition layer:
    form a type II interface, or
    have no energy barrier to a movement from the screen charges layer to the transition layer of the minority charge carriers in the absorbent layer.

7. The radiation detector according to claim 1, wherein the stack further comprises:

a second window layer made from a fifth semiconductor material having a fifth bandgap value, an intermediate layer made from a sixth semiconductor material having a sixth bandgap value, the absorbent layer being delimited in the stacking direction by the screen charges layer and the intermediate layer, the intermediate layer being delimited in the stacking direction by the absorbent layer and the second window layer, the fifth bandgap value being strictly greater than the first bandgap value and the sixth bandgap value being comprised between the fifth bandgap value and the first bandgap value.

8. The radiation detector according to claim 7, wherein the intermediate layer has a doping of the first type, a dopant density being defined for the intermediate layer, the density of dopants of the intermediate layer being greater than or equal to the density of dopants of the absorbent layer.

9. The radiation detector according to claim 1, wherein the first material, the second material, the third material and the fourth material are semiconductor materials with a base of elements from columns IIIA and VA of the periodic table of elements.

10. The radiation detector according to claim 1, wherein the first window layer includes a first portion having a doping of the second type and at least one second portion having a doping of the first type, the second portion separating each first portion from each other first portion and each first portion being surrounded by the second portion in a plane perpendicular to the stacking direction.

* * * * *